United States Patent [19]

Voorman

[11] 4,322,811
[45] Mar. 30, 1982

[54] CLAMPING CIRCUIT FOR AN ADAPTIVE FILTER

[75] Inventor: Johannes O. Voorman, Eindhoven, Netherlands

[73] Assignee: U.S. Philips Corporation, New York, N.Y.

[21] Appl. No.: 129,049

[22] Filed: Mar. 10, 1980

[30] Foreign Application Priority Data

Mar. 16, 1979 [NL] Netherlands ............... 7902094

[51] Int. Cl.³ .................. H03H 21/00; H03G 11/00
[52] U.S. Cl. ........................... 364/825; 307/556; 330/278; 375/14
[58] Field of Search ........... 364/825; 358/167, 905; 375/14; 333/18, 28; 307/555, 567; 330/278, 279

[56] References Cited

U.S. PATENT DOCUMENTS

| | | | |
|---|---|---|---|
| 3,715,670 | 2/1973 | Hirsch et al. ............... | 375/14 |
| 3,814,952 | 6/1974 | Lynn ............... | 307/565 X |
| 3,895,305 | 7/1975 | Longman, Jr. ............... | 307/562 X |
| 3,921,072 | 11/1975 | Sato ............... | 375/14 |
| 4,013,980 | 3/1977 | Schollmeier ............... | 333/18 |
| 4,044,381 | 8/1977 | Schimano et al. ............... | 358/905 X |
| 4,114,179 | 9/1978 | Ilieve ............... | 307/564 X |
| 4,184,129 | 1/1980 | Macchi et al. ............... | 333/18 |

FOREIGN PATENT DOCUMENTS 54-108521  8/1979  Japan ............................ 358/905

OTHER PUBLICATIONS

Arnon: An Adaptive Equalizer for Television Channels, IEEE Transactions on Communication, vol. Con-17, No. 6, Dec. 1969.

Primary Examiner—Felix D. Gruber
Attorney, Agent, or Firm—Thomas A. Briody; William J. Streeter; Edward W. Goodman

[57] ABSTRACT

In an adaptive filter having a delay cicuit wherein amplitude control circuits are comprised in taps of that delay circuit, which control circuits are controlled by means of an error signal which indicates the difference between an output signal of the filter and an output signal which has been brought into a desired waveform by a threshold circuit of the filter, a clamping control circuit is used which utilizes the integrated error signal as the control signal for matching the level of the output signal to a threshold level of the threshold circuit so that unwanted direct currents do not affect the amplitude control circuits.

2 Claims, 5 Drawing Figures

CLAMPING CIRCUIT FOR AN ADAPTIVE FILTER

BACKGROUND OF THE INVENTION

The invention relates to an adaptive filter including a delay circuit, taps of which comprise amplitude control circuits, and including a difference-determining circuit forming an error signal between a signal, having been corrected by the filter, with respect to a reference signal having a waveform which substantially corresponds to the desired waveform of the signal corrected by the filter, circuits for obtaining control signals for the amplitude control circuits being controlled by means of this error signal and including a clamping circuit for the signal corrected by the filter.

IEEE Transactions on Communication Technology December 1969 pages 726-734 discloses an adaptive filter of the above-mentioned kind wherein use is made for the control of a periodic non-recurrent test signal. The clamping circuit is not described.

SUMMARY OF THE INVENTION

It is an object of the invention to provide a construction of a clamping circuit for an adaptive filter which is particularly suitable for use when a signal having a sequence of consecutively occurring discrete levels, called a pulse train hereinafter, is used for controlling the adaptive filter.

According to the invention an adaptive filter of the type mentioned in the opening paragraph is therefore characterized in that the reference signal is obtained from an output of a threshold circuit to an input of which the signal, corrected by the filter, is applied via the clamping circuit, this clamping circuit being a control circuit wherein the level of the signal at the input of the threshold circuit is corrected by means of a level control signal obtained from an output of an integrator which is controlled by the error signal.

It appears that when a pulse train is used as the signal at which the setting of the filter can be controlled, such as, for example, with teletext or digital audio information in a television signal, a level to be clamped during the occurrence of the relevant digital signal, is difficult to determine by means of gate circuits, while the presence of echoes may make the signal unsuitable for the determination of a level to be clamped, also in periods other than during the occurrence of the pulse trains. The measure according to the invention offers a possibility of clamping a level very accurately in the signal during the occurrence of the pulse train.

DESCRIPTION OF THE DRAWINGS

The invention will now be further explained with reference to the drawings.

In the drawings.

DESCRIPTION OF THE PREFERRED EMBODIMENT

Figure 1:
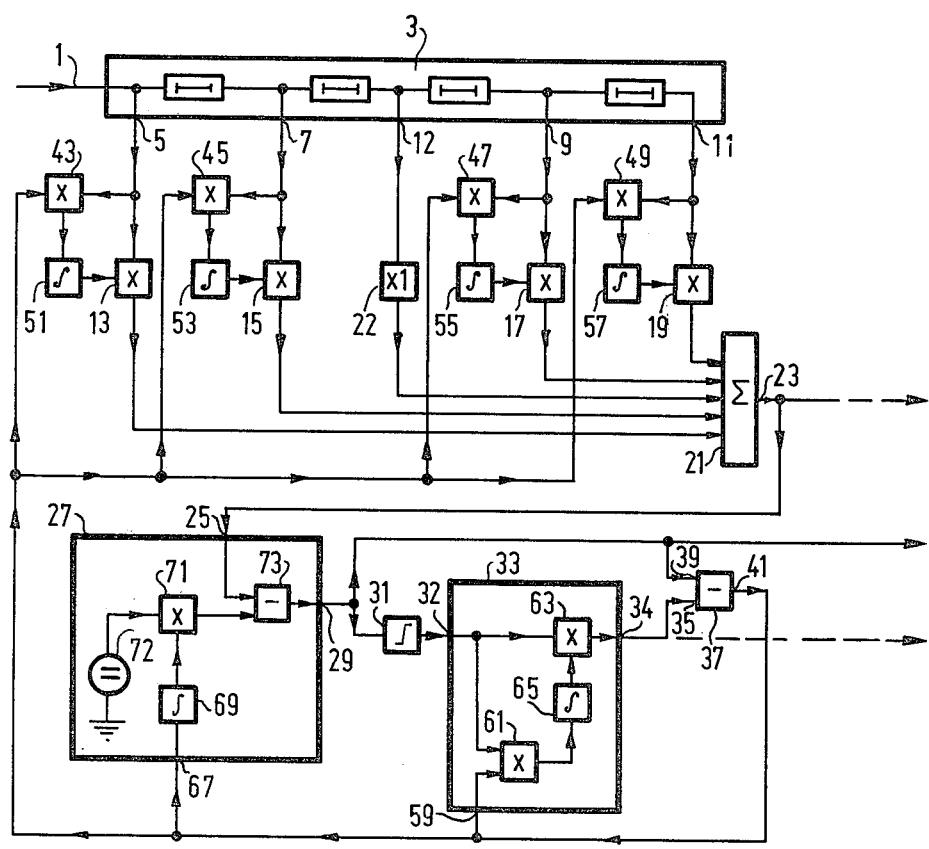
FIG. 1 illustrates an adaptive filter according to the invention by means of a block diagram.

In FIG. 1 a signal to be corrected by the filter is applied to an input 1 of an adaptive filter. For the construction of the filter which is the subject of this description, this signal is a video signal of a television signal. In certain periods of time this video signal comprises data information such as, for example, teletext information or digital audio information. This information is generally present at a level in the video signal which deviates from the zero level of that video signal.

The description of FIG. 1 relates only to the operation of the adaptive filter during the occurrence of the data signal. The subsequent Figures indicate the type of gate circuits which can enable the self-adjusting action of the filter during the occurrence of the data signal and which can retain the correcting action of the filter also for the remaining portion of the video signal.

The input 1 of the filter is also the input of a delay circuit 3 which has a number of taps 5, 7, 9, 11 and 12. The taps 5, 7, 9 and 11 are connected to an adding circuit 21 via amplitude control circuits 13, 15, 17 and 19, respectively, the tap 12 being connected thereto via a circuit 22 having a fixed transfer factor equal to unity.

A signal which is applied to an input 25 of a clamping circuit 27 is obtained from an output 23 of the adding circuit 21. The clamping circuit 27 corrects the d.c. voltage level of the data signal such that a signal obtained from an output 29 thereof is suitable for processing by a threshold circuit 31 to which it is applied.

An output signal of the threshold circuit 31 is applied to an input 32 of an automatic gain control circuit 33, an output 34 of which is connected to an input 35 of a difference-determining circuit 37, a second input 39 of which is supplied with the signal coming from the output 29 of the clamping circuit 27.

The signal obtained via the threshold circuit 31 and the automatic gain control circuit 33 at the input 35 of the difference-determining circuit is called the reference signal. By the action of the threshold circuit 31 it has a waveform which substantially corresponds to the waveform the corrected signal should have at the second input 39, which is also the output of the filter. A signal denoted the error signal and by means of which a number of automatic settings are controlled, is obtained from an output 41 of the difference-determining circuit 37.

The error signal at the output 41 of the difference-determining circuit 37 is applied to four circuits 43, 45, 47, 49, which apply control signals to the amplitude control circuits 13, 15, 17, 19, respectively, via integrators 51, 53, 55, 57, respectively, and which are constituted by a multiplier, another input of which is connected to the taps 5 and 7, 9, 11, respectively. The multipliers 43, 45, 47, 49 form in combination with the integrators 51, 53, 55, 57 so-called correlation circuits which ensure by means of the amplitude control circuits 13, 15, 17, 19 that the waveform of the corrected signal at the second input 39 of the difference-determining circuit 37 becomes substantially equal to the waveform of the reference signal at the input 35 thereof.

The error signal obtained from the output 41 of the difference-determining circuit 37 is also applied to an input 59 of the automatic gain control circuit 33. Connected to this input 59 is an input of a multiplier 61, another input of which is connected to an input of a further control circuit 63, which is connected to the input 32 of the automatic control circuit 33. The multiplier 61 has an output connected to a further input of the further control circuit 63 via an integrating circuit 65, an output of the further control circuit 63 being connected to the output 34 of the automatic gain control circuit 33. The further control circuit 63 is constituted by a multiplier.

The automatic gain control circuit 33 now controls the amplitude of the reference signal to such a value that the error signal at the output 41 of the difference-determining circuit, assumes a value which approaches the value of the desired corrected signal as closely as possible. As a result of the place where the automatic gain control is now active, an unwanted stable state can no longer occur and any direct current component in the corrected signal cannot cause a control to zero of the output signal of the filter.

The influence of the direct current component in the corrected signal on the amplitude control circuits 13, 15, 17, 19 is reduced by the clamping circuit 27, to an input 67 of which the error signal is applied, this error signal being applied via an integrating circuit 69 to an input of a multiplier 71, a further input of which is connected to a constant direct current source 72. An output of the multiplier 71 then applies such a direct current signal to an input of a subtracting circuit 73, another input of which is connected to the input 25 of the clamping circuit 27, that, in the signal at an output of the subtracting circuit 73, which is connected to the output 29 of the clamping circuit 27, a d.c. level lies between two data levels which equals a threshold value of the threshold circuit 31.

This results in that the clamping circuit 27 reduces the synchronizing time of the filter. Furthermore, it does not only compensate for a possible level in the input signal of the filter, but also for any direct current component or any asymmetry in the threshold circuit 31, caused by, for example, d.c. couplings in the filter. This renders the filter circuit very suitable for implementation as an integrated circuit.

It will be clear that the clamping circuit 27 described herein is also suitable for use in adaptive filters in which no automatic gain control circuit 33 is used in the place indicated.

Should the filter be suitable for processing a multilevel data signal instead of a two-level signal for which the above described circuit of the filter is intended, the reference signal generation and, consequently, the threshold circuit 31 and the further control circuit 63 must be adapted thereto.

In this example the error signal for the amplitude control circuits 13, 15, 17, 19 is processed in accordance with the method of minimising the mean square. It will be obvious that this can also be done in another suitable manner.

If so desired, it is alternatively possible to use, for example, a signal at the output 23 of the adding circuit 21, at the output terminal 32 of the threshold circuit 31 or at the output 34 of the automatic gain control circuit 33 as the output signal of the filter. When the output signal of the filter is obtained from the output 29 of the clamping circuit 27, the amplitude thereof can be kept constant by a control circuit which also uses the output signal of the integrator 65 as the control signal, but which controls in the sense opposite to that of the multiplying circuit 63, which may be done by means of a divider circuit. It is further possible to apply the output signal of the lastmentioned control circuit to the input 39 of the difference-determining circuit 37, provided the multiplier circuit 63 is provided at the output 41 of the difference-determining circuit 37 instead of at the input 35 thereof. In that case the output signal of the filter can be derived, if so desired, from other points in the circuit.

The described construction of the gain control circuit 33 has the advantage that it is insensitive to noise and yet controls rapidly. Other assemblies, such as for example, using peak detection to obtain the control signal are possible.

A filter according to the invention is suitable for processing synchronous and asynchronous data signals and for analog pulse-modulated signals, such as, for example, pulse width, pulse duration and pulse position modulated signals. The filter is, for example, very suitable for use in repeaters for an asynchronous signal processing because a circuit for recovering a clock signal is not required.

In a filter according to the invention the taps of the delay circuit 3 may if so desired serve as its inputs.

It is, alternatively, possible to locate the tap of the delay circuit 3 in which no control is effected in an other place then the center, as in the embodiment, and, if so desired, it may, alternatively, be given a certain degree of control.

An advantageous embodiment of the delay circuit 3 which is very suitable for implementation as integrated circuit is described in the Netherlands' Patent Application No. 7709663, corresponding to U.S. application Ser. No. 859,643, filed Dec. 12, 1977, and now U.S. Pat. No. 4,210,882, in which the different delay elements are constructed as Laguerre sections, one section of which is described with reference to FIG. 2. It will be obvious that also other types of delay circuits can be used.

The multiplying circuits used need not be linear, provided the amplitude of the output signal increases or decreases monotonously versus the amplitude of each of their input signals.

Figure 2:
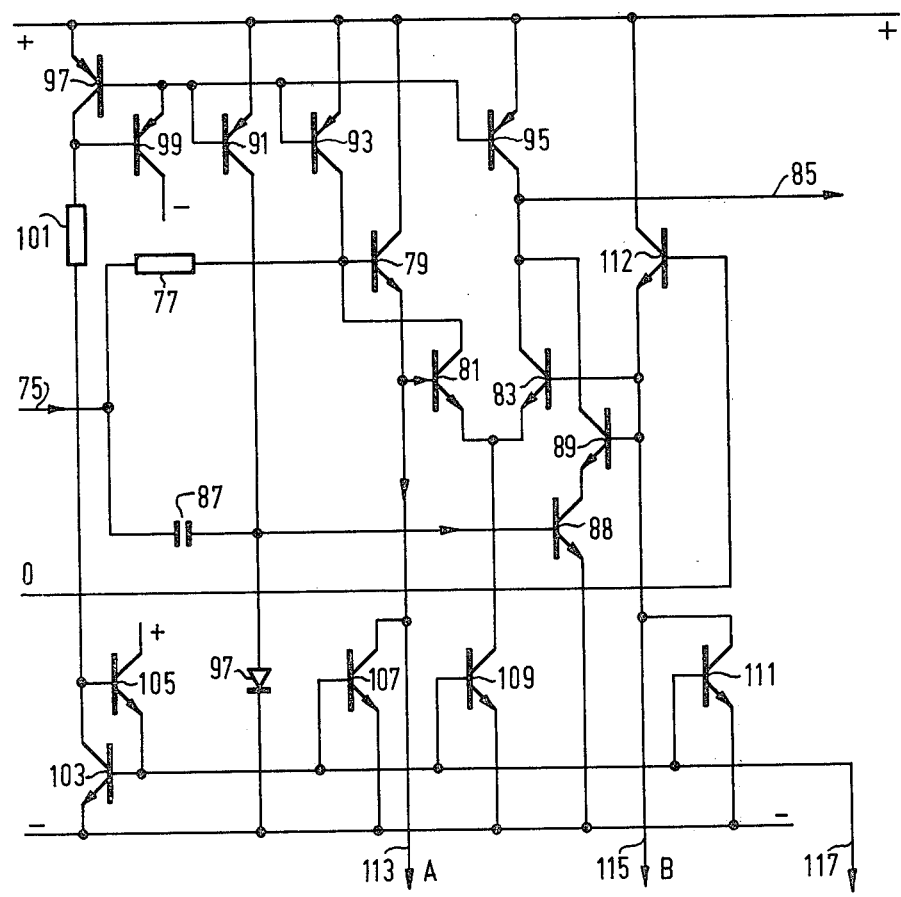
FIG. 2 shows by means of a circuit diagram, a possible construction of a delay element of a delay circuit for an adaptive filter shown in FIG. 1.

In FIG. 2 a signal, which is applied to an input 75, is applied via a resistor 77 to a Darlington emitter-follower pair 79, 81, which is coupled by means of the emitters to a transistor 83, the collector of which is connected to an output 85 from which an input signal for the following section is obtained.

The input 75 is further connected, via a capacitor 87 to the base of a transistor 88, the collector of which controls the emitter of a transistor 89. The collector of the transistor 89 is connected to the collector of the transistor 83.

Three transistors 91, 93, 95 form direct current sources for the base-emitter junction of the transistor 88, which junction is shunted by a diode 97, for the collector of the transistor 81, this collector being connected to the base of the transistor 79, and for the collectors of the transistors 83 and 89, respectively. To that end, the bases of the transistors 91, 93 and 95 are connected to the emitter, which is connected to the base of a transistor 97, of a transistor 99, the base of which, which is connected to the collector of the transistor 97, is supplied with a direct current via a resistor 101. This direct current is derived from the base, which is connected to the collector of a transistor 103, of a transistor 105, the emitter of which is connected to the base of the transistor 103 and also to the bases of three transistors 107, 109 and 111 which function as the direct current source for, in this order, the emitter, connected to the base of the transistor 81, of the transistor 79, the interconnected emitters of the transistors 81, 85 and the emitter, connected to the bases of the transistors 83 and 89, of a transistor 112, the base of which is connected to zero potential.

A signal A, which is applied to an output 113, which constitutes a tap of the delay circuit, is obtained from the emitter of the transistor 79. The signal path from the input 75 to this output 113 has a low-pass characteristic, the cut-off frequency of which is chosen near the highest frequency of the frequency band of the signal to be passed through the delay circuit. An output 115 has a reference potential B, obtained from the emitter of the transistor 112.

An output 117, which has for its function to supply direct currents to other portions of the filter, is connected to the emitter of the transistor 105.

Between the input 75 and the output 85, the circuit has a signal-delaying transfer. The product of the values of the resistor 77 and the capacitor 87 determines that time delay.

Figure 3:
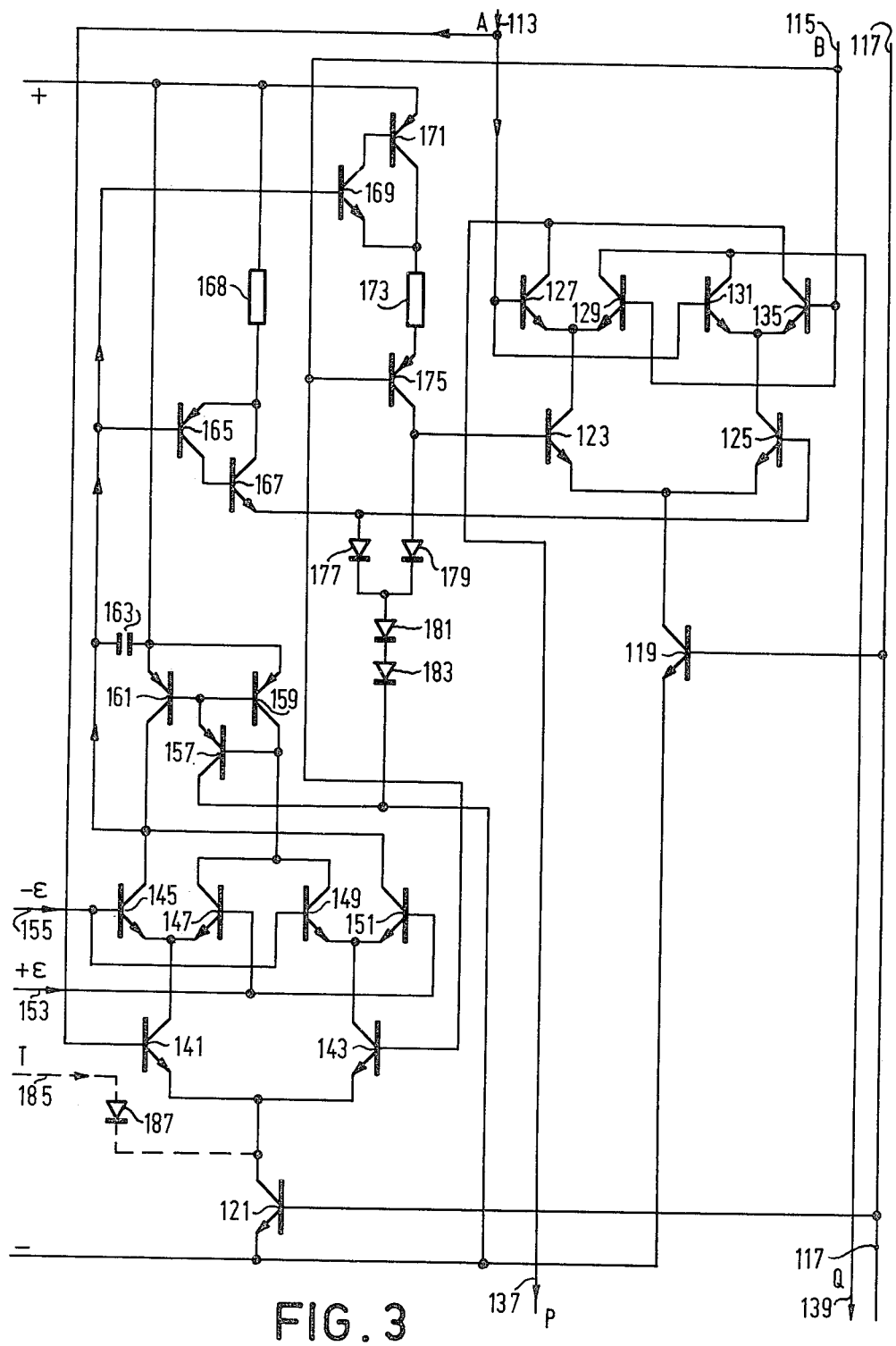
FIG. 3 shows a possible construction of an amplitude control circuit for an adaptive filter shown in FIG. 1.

The terminals 113, 115 and 117 are also terminals of the amplitude control circuit shown schematically in FIG. 3.

In this FIG. 3, the terminal 117 is connected to the bases of two current source transistors 119, 121, which each supply the direct current for a multiplying circuit.

A first multiplying circuit is formed by six transistors 123, 125, 127, 129, 131, 135. The transistors 123 and 125, 127 and 129, 131 and 135, respectively, are coupled by means of their emitters. A control signal is applied in anti-phase to the bases of the transistors 123 and 125. Hereinafter it will be explained how this control signal is obtained.

The bases of the transistors 127 and 131 are connected to the tap 113 and are supplied with the signal A from a tap of the delay circuit. The bases of the transistors 129 and 135 are connected to the terminal 115 and are supplied with the reference potential B. The collectors of the transistors 127 and 135 are connected to an output 137 and the collectors of the transistors 129 and 131 to an output 139. The outputs 137 and 139 carry the signals P and Q, the amplitude of which is controlled in the opposite phase, by the first multiplying circuit.

The second multiplying circuit is formed by six transistors 141, 143, 145, 147, 149 and 151. The transistors 141 and 143, 145 and 147, 149 and 151, respectively, are coupled by means of their emitters. The signal A derived from the terminal 113 is applied to the base of the transistor 141. The base of the transistor 143 is connected to the reference potential B of the terminal 115. The bases of the transistors 147 and 151 are connected to an input 153 to which the error signal $+\epsilon$ is applied, and the bases of the transistors 145 and 149 are connected to an input 155 to which the error signal $-\epsilon$ is applied in the opposite phase. The collectors of the transistors 147 and 149 are interconnected and connected via a current mirror circuit having three transistors 157, 159 and 161 to the interconnected collectors of the transistors 145 and 151, which supply a capacitor 163, which functions as an integrator, with a current which is a measure of the product of the error signal $\epsilon$ and the signal A obtained from the relevant tap of the delay circuit.

Consequently, there is produced across the capacitor 163, a control signal which is applied to the base of the transistor 125 via a pair of complementary transistors 165, 167 arranged as an artificial transistor and having an emitter resistor 168, and in antiphase to the base of the transistor 124 via a pair of complementary transistors 169, 171 arranged as an artificial transistor, a resistor 173 and a transistor 175. A circuit having a number of diodes 177, 179, 181 and 183 at the bases of the transistors 123, 125 converts the currents produced by the pairs of transistors 165, 167 and 169, 171 into voltages of a suitable level.

The artificial transistors 165, 167 and 169, 171 are complementary and their base currents are equal and opposite, when the voltage at the capacitor 163 is at a value determined by the resistors 168 and 173, which value adjusts itself if no control current is supplied by the multiplier 145, 147, 149, 151, as is the case at the beginning of the control, action. The current gains of the artificial transistors 165, 167 and 169, 171 are equal, so that at the beginning of a control the voltage at the bases of the transistors 123 and 125 is equal and the gain of the first multiplying circuit 123, 125, 127, 131, 135 is zero.

If so desired, the second multiplying circuit 141, 143, 145, 147, 149, 151 can be made inactive by temporarily cutting off the transistors 141, 143 by applying a gating signal T to an input 185, which gating signal is applied to the emitters of the transistors 141, 143 via a diode 187. This does not affect the control voltage at the capacitor 163, so that an amplitude setting of the first multiplier obtained by means of the control is retained for some time.

Figure 4:
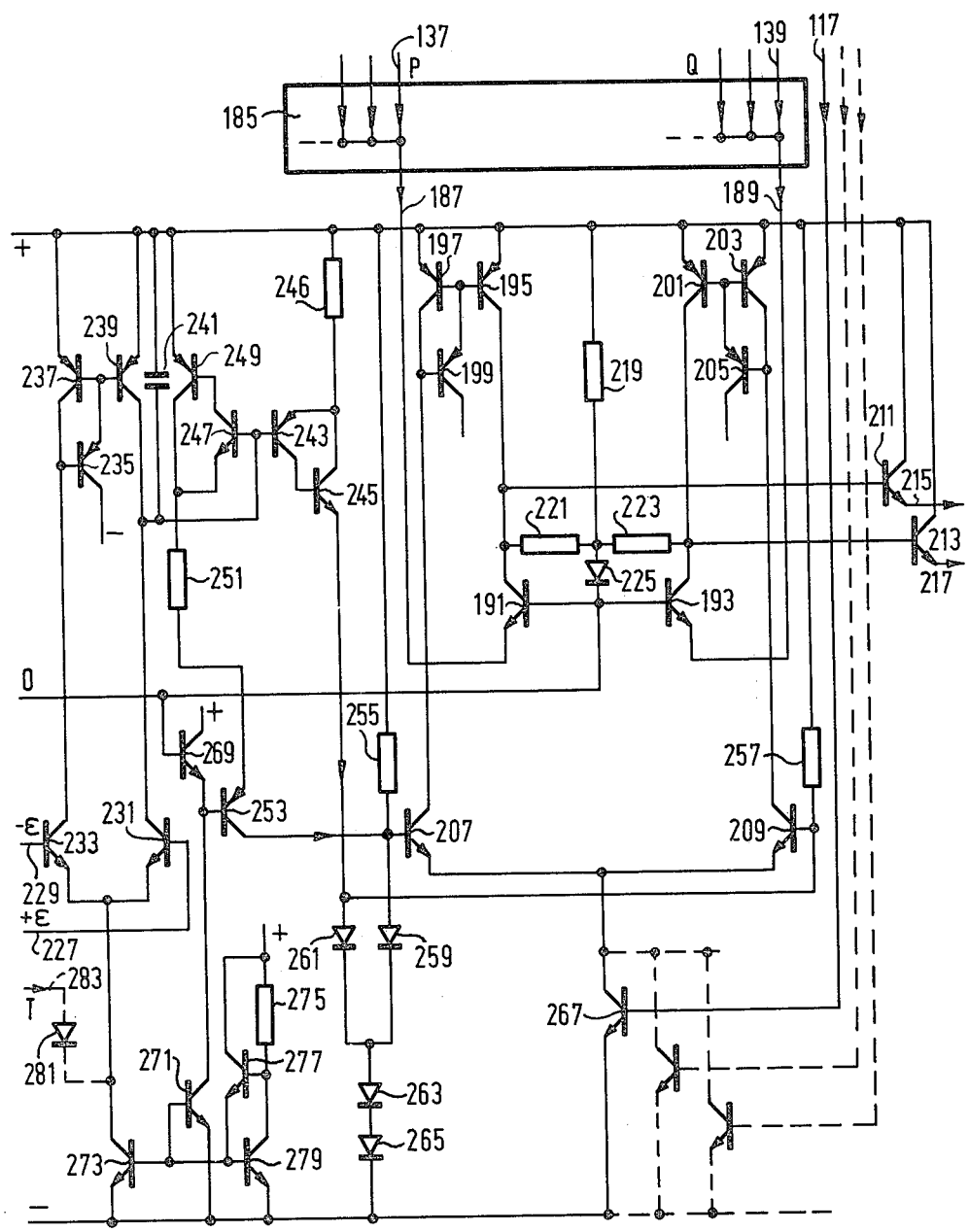
FIG. 4 shows a construction of a clamping circuit in accordance with a further elaboration of the invention for an adaptive filter shown in FIG. 1.

In FIG. 4 the signals P and Q derived from the terminals 137 and 139 of the amplitude control circuits are added together by an adding circuit 185 and applied to inputs 187 and 189 of a subtracting circuit having eight transistors 191, 193, 195, 197, 199, 201, 203 and 205. The other inputs of the subtracting circuit are the collectors of an emitter-coupled pair of transistors 207, 209. The outputs of the subtracting circuit, which are constituted by the interconnected collectors of the transistors 191, 195 and 193, 201, respectively, supply clamped output signals in anti-phase to two outputs 215, 217 via two emitter followers 211, 213. A circuit comprising three resistors 219, 221, 223 and a diode 225, connected to zero potential, to which also the bases of the transistors 191, 193 are connected, forms the output circuit of the subtracting circuit.

Clamping is effected by correcting in the subtracting circuit the d.c. component of the signal at the inputs 187, 189 by means of the direct currents supplied to the transistors 199, 197, 195 and 205, 203, 201, respectively, which are arranged as current mirror circuits, via the emitter-coupled pair of transistors 207, 209.

These direct currents are derived from the error signal $+\epsilon$ and $-\epsilon$ which is applied in antiphase to two inputs 227, 229 and which controls the bases of an emitter-coupled pair of transistors 231, 233. The collector of the transistor 223 is connected to the collector of the transistor 231 via a current mirror circuit comprising three transistors 235, 237, 239, so that a difference current, which is a measure of the mean voltage difference at the inputs 227, 229, is applied to a capacitor 241, which functions as an integrator in this collector circuit. This difference current creates a control voltage across the capacitor 241, this voltage controlling the base of the transistor 209 via a pair of complementary transistors 243, 245 arranged as an artificial transistor and having an emitter resistor 246, and the base of the transistor 207 via a pair of complementary transistors 247, 249 arranged as an artificial transistor, a resistor 251 and a transistor 253 such that variations occur in anti-phase at the bases of the transistors 207, 209.

Connected to the bases of the transistors 207, 209 is a further diode circuit 259, 261, 263, 265 which is fed by two resistors 255, 257 and converts the currents supplied by the artificial transistors 243, 245 and 247, 249, respectively, into voltages of a suitable level for controlling the bases of the pair of transistors 207, 209. The resistors 255 and 257 are provided to adapt the control range of the clamping circuit.

The pair of transistors 207, 209 obtains its direct current from a current source transistor 267, the base of which is connected to the terminal 117. Each Laguerre section, as shown schematically in FIG. 2 is provided with such a current source transistor, as indicated in FIG. 4 by means of broken lines. They compensate for the direct currents which are applied to the inputs 187 and 189 by means of the signals P and Q.

The base of the transistors 253 is connected to zero potential via an emitter-follower 269. The emitter current for the emitter follower 269 is supplied by a current source transistor 271.

The direct current for the pair of transistors 231, 233 is supplied by a current source transistor 273. The bases of the current source transistors 271 and 273 are controlled by a resistor 275 and two transistors 277, 279.

The generation of the control voltage can be temporarily made inactive by cutting off the transistors 231, 233 by means of a gating signal T obtained from an input 283 and applied to the emitters of these transistors 231, 233 via a diode 281. Then the voltage across the capacitor 241 is not affected.

Figure 5:
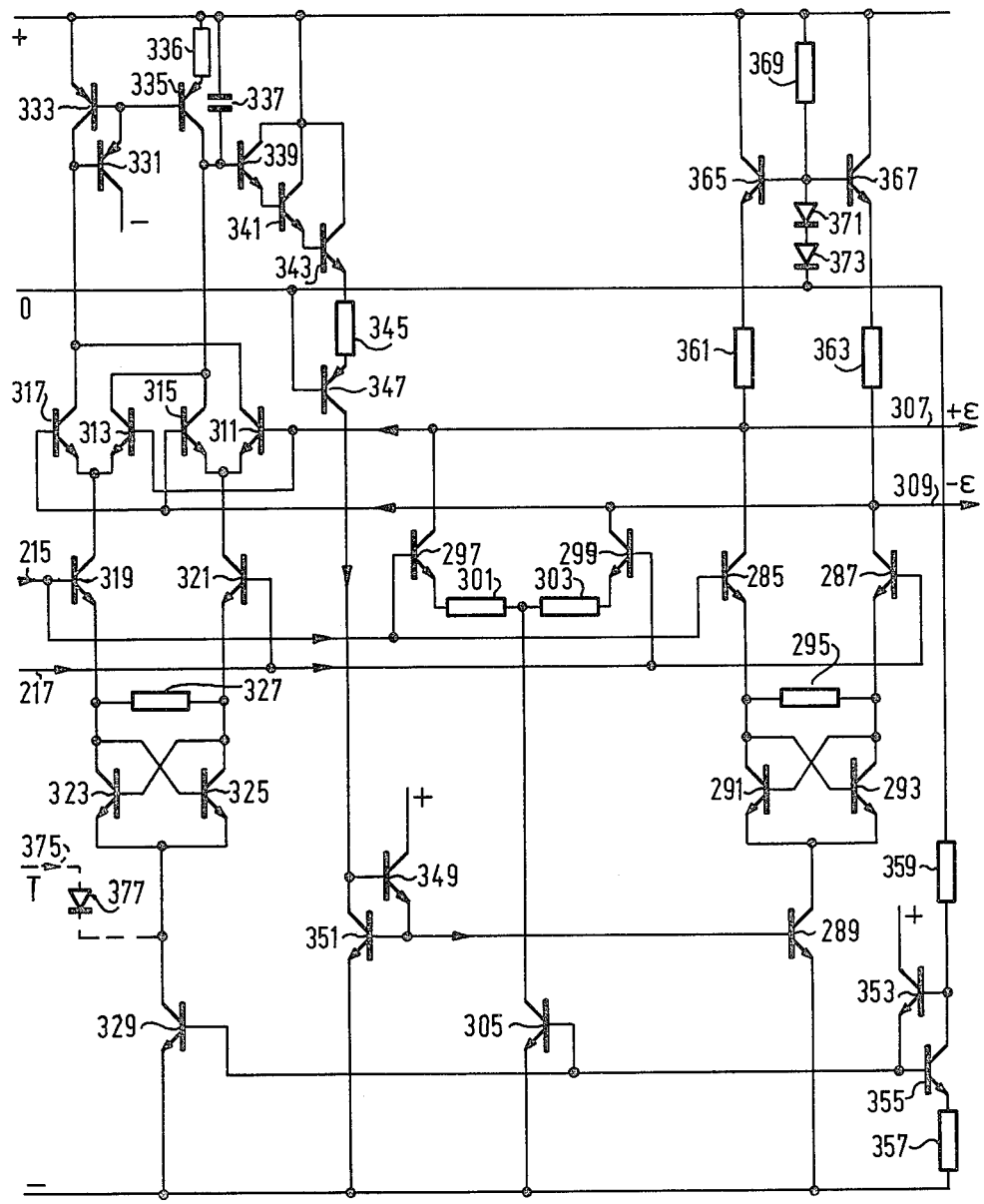
FIG. 5 shows a possible construction of a threshold circuit and a further control circuit for an adaptive filter as shown in FIG. 1.

The outputs 215 and 217 of the clamping circuit of FIG. 4 constitute outputs of the filter circuit and are also inputs of the circuit shown in FIG. 5.

In FIG. 5 the clamped signal at the inputs 215, 217 is applied in anti-phase to the bases of two transistors 285, 287 which form in combination with a transistor 289, included in the emitter circuits of these transistors, the further control circuit, the control signal being applied to the base of the transistor 289. The manner in which this control signal is obtained will be described hereinafter. A flip-flop circuit comprising two transistors 291, 293 and a resistor 295 is arranged between the collector of the transistor 289 and the emitters of the transistors 285, 287 so that the further control circuit for the signal at the bases of the transistors 285, 287 also operates as threshold circuit, so that a two-level signal, the amplitude of which is determined by the control voltage at the base of the transistor 289, is obtained at the collectors of the transistors 285, 287. When the base of the transistor 285 is positive with respect to the base of the transistor 287, the transistor 291 is cut-off and the transistor 293 conducts, so that the current of the current source transistor 289 flows via the transistor 287 and when the base of the transistor 285 is negative with respect to the base of the transistor 287 this current flows via the transistor 285.

The signals at the inputs 215, 217 are also applied to the bases of two transistors 297, 299, the emitters of the which are connected to the collector of a direct current transistor 305 via resistors 301, 303, the collectors being connected to the collectors of the transistors 285 and 287, respectively. As a consequence, the collector circuit of these four transistors 285, 287, 297, 299 forms a difference-determining circuit in which the output signal of the filter, applied via the transistors 297, 299, and a reference signal supplied by the transistors 285, 287, and having an amplitude which is controlled at the base of the transistor 289 by control signal, are subtracted from one another so that the error signal is applied in anti-phase+$\epsilon$ and $-\epsilon$ to two outputs 307, 309.

This error signal is further applied to the bases of two transistors 311, 313 and 315, 317, respectively. The emitters of the transistors 313 and 317 are connected to the collector of a transistor 319 and the emitters of the transistors 311 and 315 to the collector of a transistor 321, the bases of which are controlled by the signal at the inputs 215, 217, and the emitters of which are connected to the collector of a direct current source transistor 329 via a flip-flop circuit, which functions as a threshold circuit and which comprises two transistors 323, 325 and a resistor 327. Via a current mirror circuit comprising three transistors 331, 333 and 335 and a resistor 336, the interconnected collectors of the transistors 311 and 317 are connected to the interconnected collectors of the transistors 313 and 315 so that the last-mentioned transistors supply a difference current to a capacitor 337 which functions as an integrator, this difference current producing a voltage across that capacitor 337 which is a measure of the value of the error signal multiplied by the sign of the output signal of the filter.

Via three emitter followers 339, 341, 343 and a resistor 345, the voltage at the capacitor 337 is applied to the emitter of a transistor 347, the base of which is connected to zero potential and whose collector applies a control signal to two transistors 349, 351 which form a current mirror circuit with the transistor 289.

The transistors 305 and 329 form in combination with two transistors 353, 355 and a resistor 357, a current mirror circuit which is controlled by a resistor 359 from zero potential.

The direct currents are applied to the collectors of the transistors 285, 287, 297 and 299 via resistors 361, 363 and emitter followers 365, 367, the bases of these emitter followers having been connected at a suitable level to zero potential via a resistor-diode network 369, 371, 373. The resistors 361, 363 are low-value resistors and compensate for any inequalities in the transistors 365, 367.

The transistors 319 and 321 can be temporarily cut-off by a gating signal T which can be applied to an input 375 and can take over the collector current of the transistor 329 via a diode 377. This does not effect the voltage at the capacitor 337.

For clearness' this construction of FIG. 5 shows two threshold circuits 291, 293, 295 and 323, 325, 327 instead of the sole threshold circuit indicated in FIG. 1 by means of reference numeral 31.

The non-controlled circuit 22 of FIG. 1 can, for example, be derived from a circuit shown in FIG. 3 by arranging the emitter-collector path of a transistor, the base of which is connected to such a voltage that the transistors 123 and 125 are cut-off, in parallel with the emitter-collector path of the transistor 125.

What is claimed is:

1. A clamping circuit for an adaptive filter, said filter including a delay circuit having a plurality of taps thereto, a plurality of amplitude control circuits coupled respectively to said plurality of taps, correlation circuits for respectively providing control signals for said amplitude control circuits, means for combining the outputs from said amplitude control circuits for providing a corrected output signal of said filter, and a difference determining circuit having inputs coupled respectively to the corrected signal output of the filter and to a threshold circuit, which provides a reference signal, and an output for providing an error signal which, in turn, is applied to said correlation circuits, characterized in that said clamping circuit has an input connected to the corrected signal output of the filter and an output coupled respectively to said threshold circuit and to one of said inputs of said difference determining circuit, said clamping circuit comprising a control circuit, for correcting the level of the corrected output signal of the filter, having a first input connected to the clamping circuit input, a second input for receiving a level control signal and an output connected to the clamping circuit output, and an integrator having an input for receiving said error signal and an output, for providing said level control signal, coupled to said second input of said control circuit.

2. A clamping circuit as claimed in claim 1, characterized in that said control circuit comprises a multiplying circuit having a first input coupled to the output of said integrator, a second input coupled to a source of direct current and an output, and a difference determining circuit having a first input for receiving the corrected output signal of said filter, a second input connected to the output of said multiplying circuit and an output connected to the output of said clamping circuit.

* * * * *